(12) United States Patent
Lee et al.

(10) Patent No.: US 9,888,569 B2
(45) Date of Patent: Feb. 6, 2018

(54) PRINTED CIRCUIT BOARD HAVING BURIED CIRCUIT PATTERN AND METHOD FOR MANUFACTURING THE SAME

(71) Applicant: LG INNOTEK CO., LTD., Seoul (KR)

(72) Inventors: Sang Myung Lee, Seoul (KR); Byeong Ho Kim, Seoul (KR); Jae Seok Park, Seoul (KR); Yeong Uk Seo, Seoul (KR); Hyun Seok Seo, Seoul (KR); Chang Woo Yoo, Seoul (KR); Kyu Won Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 22 days.

(21) Appl. No.: 14/432,278

(22) PCT Filed: Oct. 4, 2013

(86) PCT No.: PCT/KR2013/008910
§ 371 (c)(1),
(2) Date: Mar. 30, 2015

(87) PCT Pub. No.: WO2014/054921
PCT Pub. Date: Apr. 10, 2014

(65) Prior Publication Data
US 2015/0257262 A1   Sep. 10, 2015

(30) Foreign Application Priority Data

Oct. 4, 2012  (KR) .................. 10-2012-0109926

(51) Int. Cl.
*H05K 1/09* (2006.01)
*H05K 1/03* (2006.01)
*H05K 3/10* (2006.01)
*H05K 3/40* (2006.01)
(Continued)

(52) U.S. Cl.
CPC ......... *H05K 1/0346* (2013.01); *H05K 1/0298* (2013.01); *H05K 1/0366* (2013.01); *H05K 1/0373* (2013.01); *H05K 1/115* (2013.01); *H05K 1/119* (2013.01); *H05K 3/107* (2013.01); *H05K 3/4007* (2013.01);
(Continued)

(58) Field of Classification Search
CPC .. H05K 1/0346; H05K 1/0298; H05K 1/0366; H05K 1/115; H05K 1/119; H05K 3/465
USPC .................. 174/251; 175/250, 255–259, 261
See application file for complete search history.

(56) References Cited

U.S. PATENT DOCUMENTS

2002/0066672 A1   6/2002   Iijima et al.
2003/0161129 A1   8/2003   Kusano et al.
(Continued)

FOREIGN PATENT DOCUMENTS

CN   101170879 A   4/2008
JP   2002-111174 A   4/2002
(Continued)

OTHER PUBLICATIONS

Search Report for International Application No. PCT/KR2013/008910.
(Continued)

*Primary Examiner* — Tremesha S Willis
(74) *Attorney, Agent, or Firm* — LRK Patent Law Firm

(57) ABSTRACT

A printed circuit board includes a core insulating layer including an isotropic resin, a first circuit pattern filled in a circuit pattern groove at an upper portion or a lower portion of the core insulating layer, a first insulating layer provided in a top surface thereof with a circuit pattern groove and covering the first circuit pattern, and a second circuit pattern to fill the circuit pattern groove of the first insulating layer. A material, such as polyimide, having an isotropic structure is employed for the core insulating layer, thereby preventing the substrate from being bent without glass fiber. Since the glass fiber is not included, the buried pattern is formed at the upper portion or the lower portion of the core insulating layer, so that the thin substrate is fabricated.

5 Claims, 8 Drawing Sheets

(51) Int. Cl.
    *H05K 3/46*    (2006.01)
    *H05K 1/02*    (2006.01)
    *H05K 1/11*    (2006.01)
    *H05K 3/00*    (2006.01)
(52) U.S. Cl.
    CPC .......... *H05K 3/465* (2013.01); *H05K 3/0032* (2013.01); *H05K 2201/0367* (2013.01); *H05K 2201/096* (2013.01); *H05K 2203/041* (2013.01)

(56) References Cited

U.S. PATENT DOCUMENTS

| | | |
|---|---|---|
| 2008/0041621 A1 | 2/2008 | Hsu et al. |
| 2008/0093111 A1 | 4/2008 | Tsurumi |
| 2011/0067233 A1 | 3/2011 | Kang et al. |
| 2013/0062099 A1* | 3/2013 | Hunrath ............... H05K 3/4069 174/251 |

FOREIGN PATENT DOCUMENTS

| | | |
|---|---|---|
| JP | 2006-049536 A | 2/2006 |
| KR | 10-2010-0109698 A | 10/2010 |

OTHER PUBLICATIONS

SIPO Office Action for Chinese Application No. 201380051846.1 dated Mar. 13, 2017.
TIPO office action for Taiwanese Application No. 102135848 dated Mar. 24, 2017.

* cited by examiner

[Fig. 8]
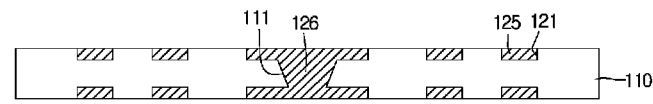
[Fig. 9]
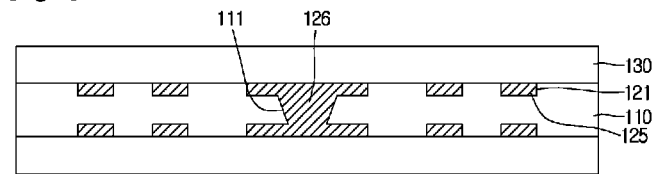
[Fig. 10]
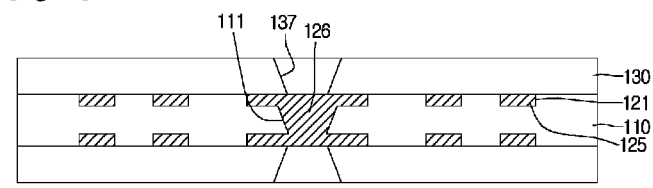
[Fig. 11]
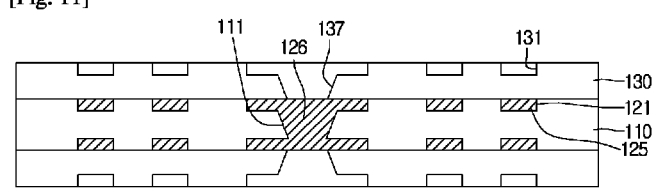
[Fig. 12]
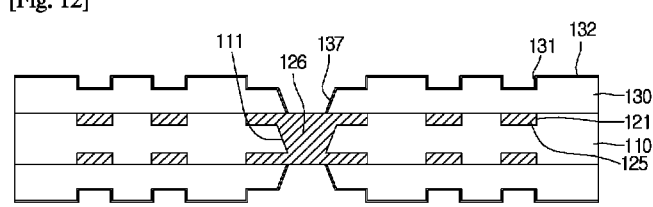
[Fig. 13]
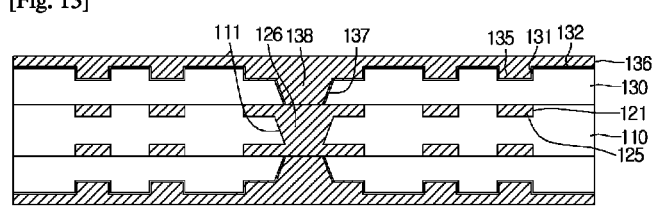

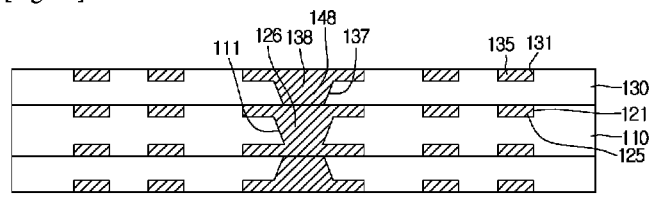
[Fig. 14]
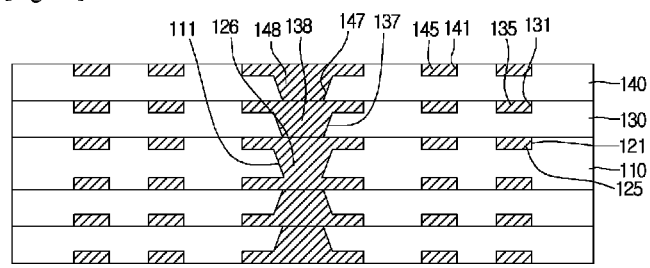
[Fig. 15]
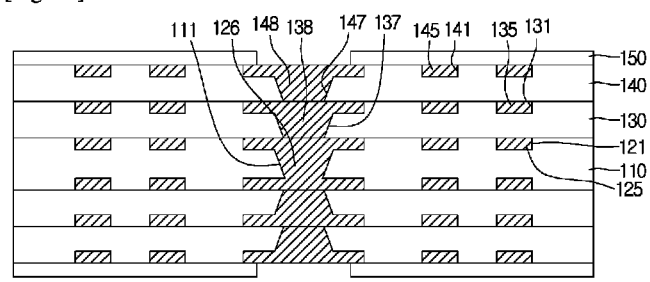
[Fig. 16]
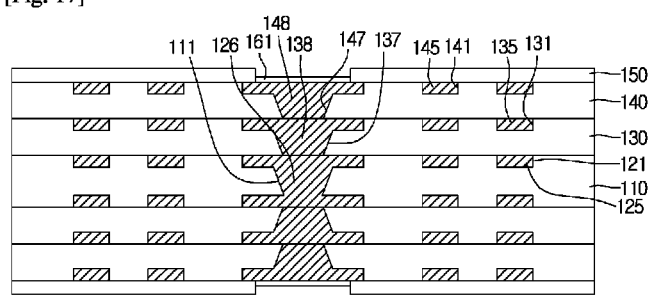
[Fig. 17]

[Fig. 18]
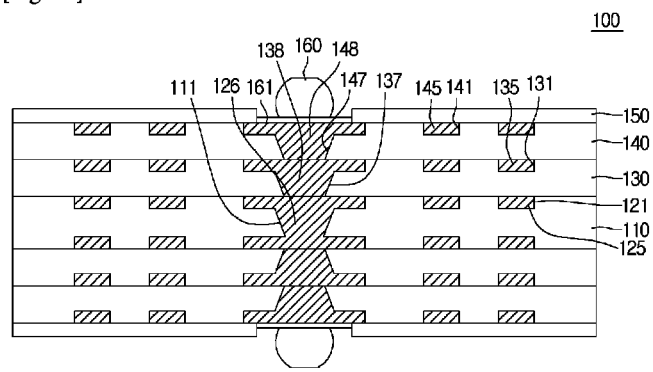
[Fig. 19]
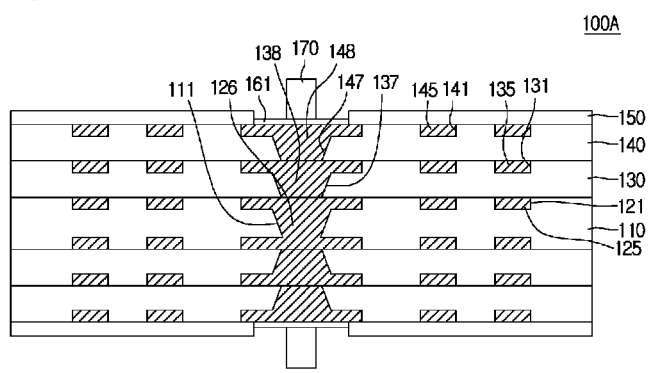
[Fig. 20]
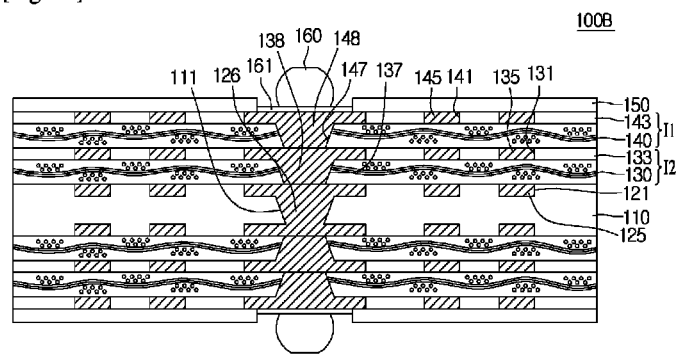
[Fig. 21]
[Fig. 22]
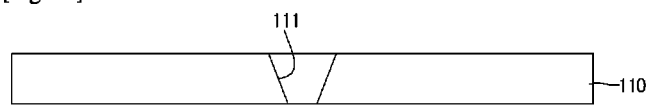

[Fig. 23]
[Fig. 24]
[Fig. 25]
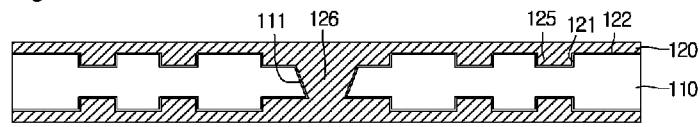
[Fig. 26]
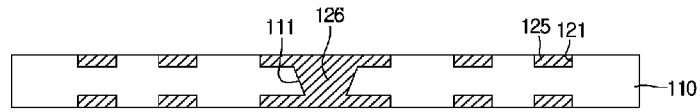
[Fig. 27]
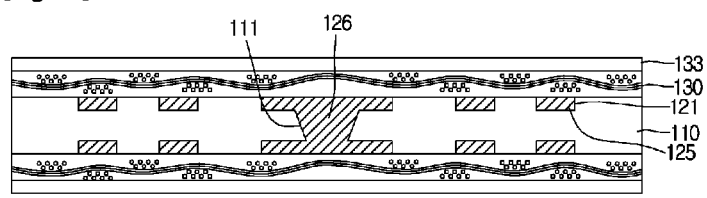
[Fig. 28]
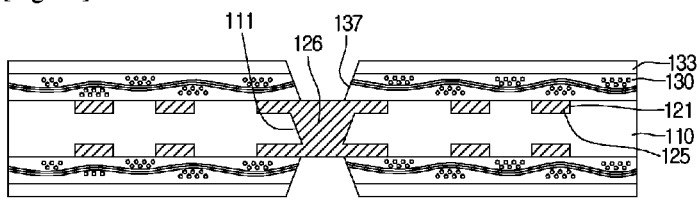
[Fig. 29]
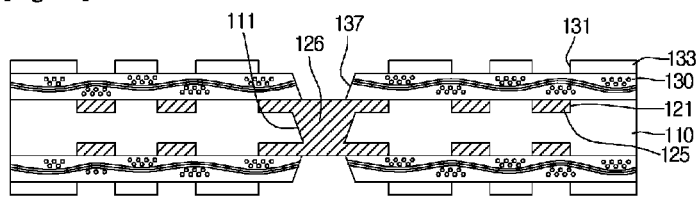
[Fig. 30]
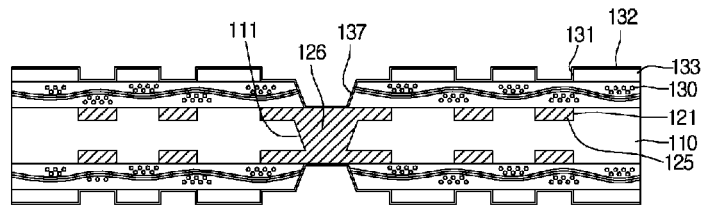

[Fig. 31]
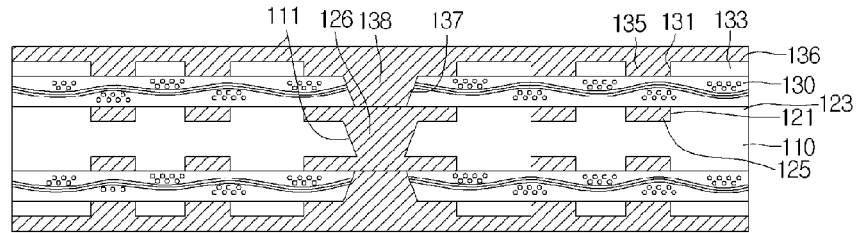
[Fig. 32]
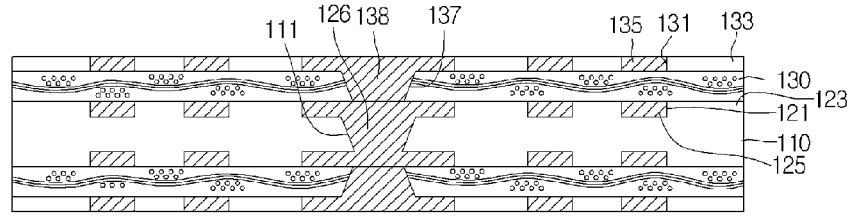
[Fig. 33]
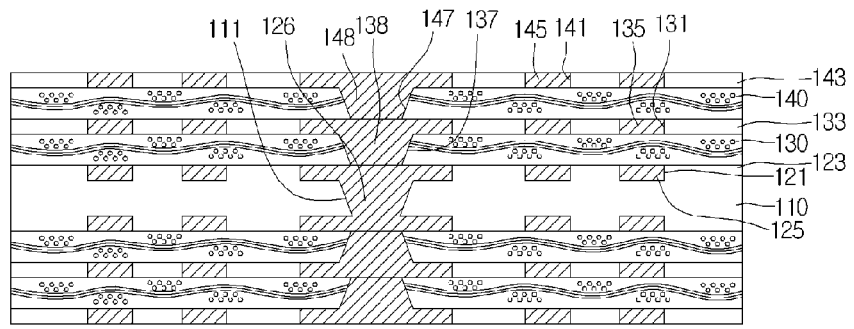
[Fig. 34]
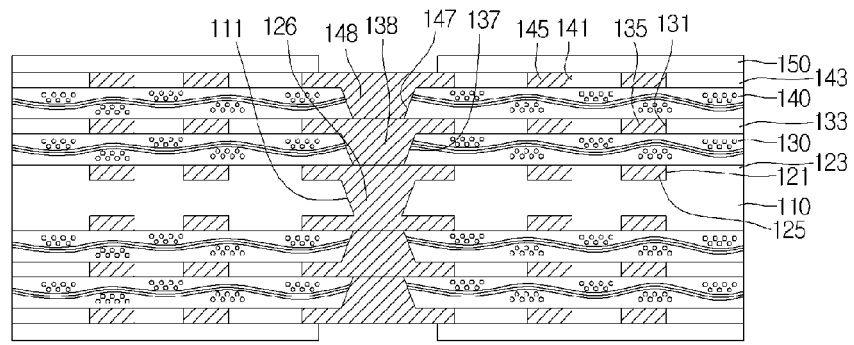
[Fig. 35]
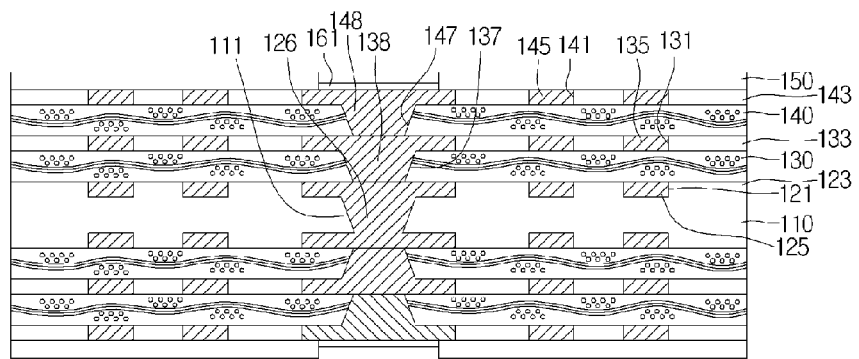

[Fig. 36]
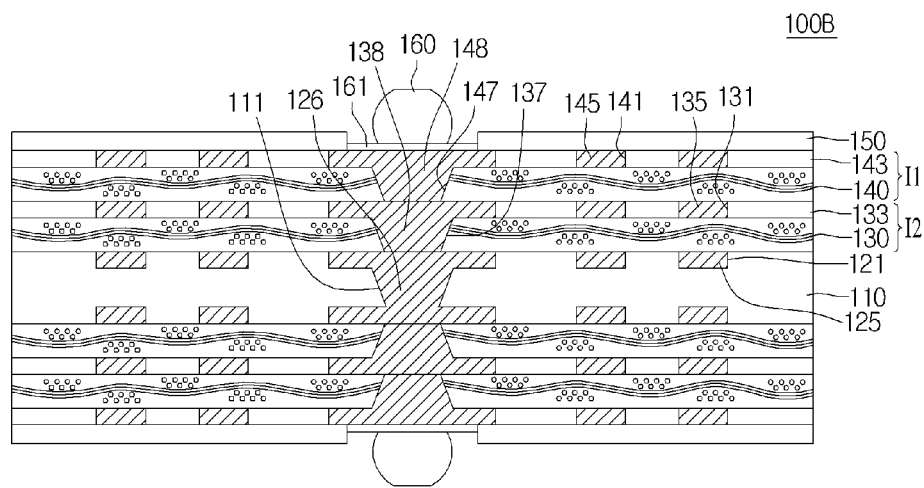
[Fig. 37]
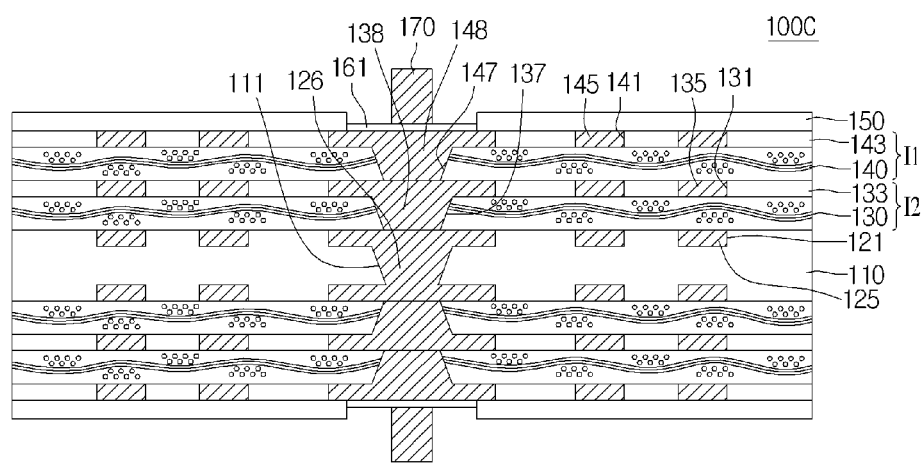

PRINTED CIRCUIT BOARD HAVING BURIED CIRCUIT PATTERN AND METHOD FOR MANUFACTURING THE SAME

TECHNICAL FIELD

The disclosure relates to a printed circuit board and a method of manufacturing the same.

BACKGROUND ART

A printed circuit board (PCB) is formed by printing a circuit line pattern on an electrical insulating substrate by using a conductive material such as copper (Cu), and refers to a board right before electronic parts are mounted thereon. In other words, the PCB refers to a circuit board in which the mounting positions of the electronic parts are determined, and a circuit pattern connecting the electronic parts to each other is fixedly printed on the surface of a flat plate so that several types of many electronic devices are densely mounted on the flat plate Meanwhile, in recent years, a buried pattern substrate having the reduced thickness and planarized surface has been used for the purpose of high performance and miniaturization of electronic parts.

FIG. 1 is a sectional view showing a typical buried pattern PCB 10.

As shown in FIG. 1, the buried pattern PCB 10 includes a buried pattern groove 2 in the surface of an insulating substrate 1 and a circuit pattern 3 formed by filling the buried pattern groove 2 through a plating process.

The PCB 10 having the buried circuit pattern 3 can represent very strong adhesive strength with respect to an insulating member due to the formation structure of a base circuit pattern and a contact part, and the pitches of base circuit patterns and contact parts can be uniformly and finely formed.

DISCLOSURE OF INVENTION

Technical Problem

However, when the buried circuit pattern 3 is formed through the plating scheme, plating variation occurs between a region having the pattern groove 2 and a region having no the pattern groove 2, so that the etching process may not be uniformly performed after the plating process. Therefore, one region of the circuit pattern 3 may be not etched as shown in FIG. 1, so that the circuit pattern 3 may be shorted with respect to an adjacent circuit pattern. In addition, another region of the circuit pattern 3 may be over-etched, so that errors may occur in signal transmission.

Solution to Problem

The embodiment provides a printed circuit board having a buried circuit pattern.

The embodiment provides a method of fabricating a buried circuit pattern.

According to the embodiment, there is provided a printed circuit board including a core insulating layer comprising an isotropic resin, a first circuit pattern filled in a circuit pattern groove at an upper portion or a lower portion of the core insulating layer, a first insulating layer provided in a top surface thereof with a circuit pattern groove and covering the first circuit pattern, and a second circuit pattern to fill the circuit pattern groove of the first insulating layer.

According to the embodiment, there is provided a method of manufacturing a printed circuit board. The method includes forming a first circuit pattern groove in an upper portion or a lower portion of a core insulating layer including an isotropic resin, forming a plating layer to cover a top surface of the core insulating layer by filling the first circuit pattern groove through a plating process, forming a first circuit pattern by removing the plating layer until the core insulating layer is exposed, forming a first insulating layer to cover a first buried pattern, and forming a second circuit pattern buried in the first insulating layer.

Advantageous Effects of Invention

As described above, a material, such as polyimide, having an isotropic structure is employed for the core insulating layer, thereby preventing the substrate from being bent without glass fiber. In addition, since the glass fiber is not included, the buried pattern can be formed at the upper portion or the lower portion of the core insulating layer, so that the thin substrate can be fabricated.

In addition, the buried-type micro-circuits can be formed with high reliability through a laser trench technology, and the degree of the integration can be improved.

As described above, an amount of copper (Cu) applied to the circuit pattern is reduced through the laser trench technology, so that the application of Cu representing high thermal expansion coefficient is reduced, thereby preventing the substrate from being bent.

In addition, after the insulating layer including resin having fillers therein is bonded, the buried pattern can be formed in the insulating layer. Accordingly, the buried pattern can be formed while maintaining stiffness by glass fiber provided at the lower portion.

BRIEF DESCRIPTION OF DRAWINGS

FIGS. 3 to 18 are sectional views showing a method of manufacturing a PCB of FIG. 2.

FIG. 19 is a sectional view showing a PCB according to a second embodiment.

FIG. 20 is a sectional view showing a PCB according to a third embodiment.

FIGS. 21 to 36 are sectional views showing a method of manufacturing the PCB of FIG. 20.

FIG. 37 is a sectional view showing a PCB according to a fourth embodiment.

BEST MODE FOR CARRYING OUT THE INVENTION

Figure 1:
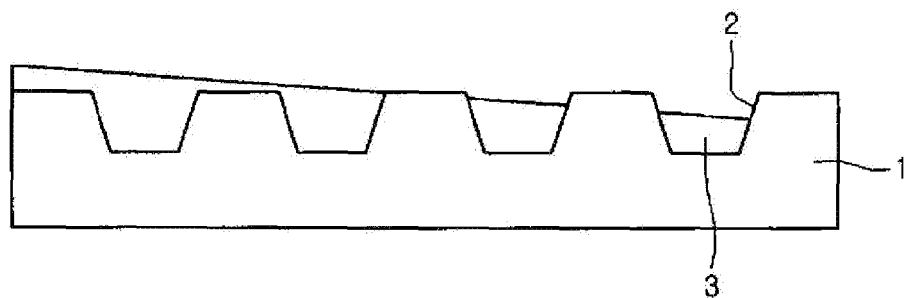
FIG. 1 is a sectional view showing a PCB according to the related art.

Hereinafter, embodiments will be described in detail with reference to accompanying drawings so that those skilled in the art can easily work with the embodiments. However, the embodiments may have various modifications.

In the following description, when a predetermined part "includes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, or a plate is referred to as being "on" or "under" another layer, another film, another region, or another plate, it can be "directly" or "indirectly" on the other layer, film, region, plate, or one or more intervening layers may also be present. On the contrary, if a part is directly positioned on another part, it refers to that there is no intervening part between the part and the another part.

The present invention provides a printed circuit board in which a circuit pattern is formed in a buried type, that is, a printed circuit board having a reduced thickness by forming a buried pattern in a core insulating layer that does not include glass fiber Hereinafter, a printed circuit board according to a first embodiment will be described with reference to FIGS. 2 to 18.

Figure 2:
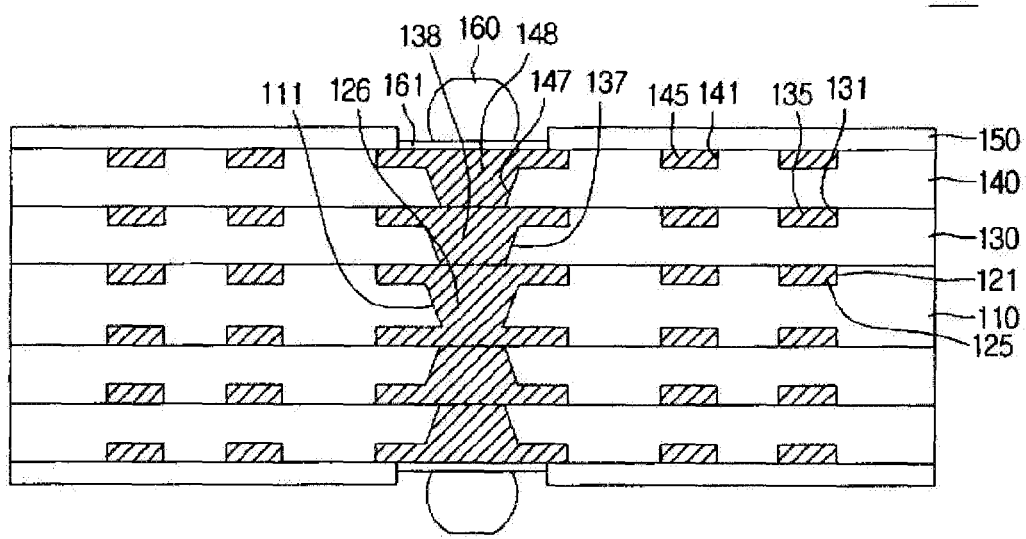
FIG. 2 is a sectional view showing a PCB according to a first embodiment.

FIG. 2 is a sectional view showing the printed circuit board according to the first embodiment.

Referring to FIG. 2, a printed circuit board 100 according to the first embodiment includes a core insulating layer 110, first to third circuit patterns 125, 135, and 145 formed on upper and lower portions of the core insulating layer 110, and first and second insulating layers 130 and 140 to bury the second and third circuit patterns 135 and 145.

The core insulating layer 110 may include a resin substrate having no glass fiber. The core insulating layer 110 may include a material having stiffness, preferably, polyimide film to satisfy following chemical formula.

[Chemical Formula 1]

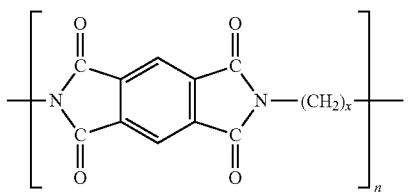

In chemical formula 1, n is a positive integer.

That is to say, in the core insulating layer 110, fillers may be dispersed in the polyimide resin expressed by the above chemical formula.

The filler may include AlO3 or SiO2 having a spherical shape or a rod shape.

The thickness of the core insulating layer 110 may be in the range of 15 µm to 200 µm, preferably, in the range of 100 µm to 150 µm.

The core insulating layer 110 may include a via hole 111 formed through the core insulating layer 110.

As shown in FIG. 2, the via hole 111 may have the shape having a sectional area increased upward. Alternatively, the via hole 111 may have a symmetric structure about a central region, but the embodiment is not limited thereto.

A conductive via 126 may be formed by filling the via hole 111, and may include a metallic material such as an alloy including at least one of aluminum (Al), copper (Cu), silver (Ag), platinum (Pt), nickel (Ni), or palladium (Pd).

First circuit pattern grooves 121 may be formed in the upper portion or the lower portion of the core insulating layer 110. A plurality of first circuit patterns 125 are filled in the first circuit pattern grooves 121 while serving as base circuit patterns.

The first circuit patterns 125 may include a material representing high electrical conductivity and low resistance, that is, may include a metallic material such as an alloy including at least one of Al, Cu, Ag, Pt, Ni, or Pd.

In this case, the first circuit pattern 125 may be formed in a single layer. Alternatively, the first circuit pattern 125 may be formed in a plurality of layers. If the first circuit pattern 125 is formed through a plating process, an electro-plated layer may be formed on a seed layer.

The seed layer may include Cu, Ni, or the alloy thereof, and the electro-plated layer formed on the seed layer may include the alloy including at least one of Al, Cu, Ag, Pt, Ni, and Pd.

An extension part may be formed on the top surface or the bottom surface of the core insulating layer 110 while extending from the via 126. The extension part may have the same depth as that of the first circuit pattern 125. The extension part and the first circuit pattern 125 may have micro-depths satisfying the range of 10 µm to 20 µm.

Meanwhile, the first and second insulating layers 130 and 140 are formed at the upper portion or the lower portion of the core insulating layer 110.

The first and second insulating layers 130 and 140 may have a two-layer structure as shown in FIG. 2. An insulating layer formed on the core insulating layer 110 may be the first insulating layer 130, and the second insulating layer 140 may be formed on the first insulating layer 130.

The first and second insulating layers 130 and 140 may include insulating layers having no glass fiber, preferably, may include a resin material including epoxy resin.

The first and second insulating layers 130 and 140 may include the same material, and may have the thicknesses thicker than that of the core insulating layer 110.

The first and second insulating layers 130 and 140 are provided in the surfaces thereof with second and third circuit pattern grooves 131 and 141 to form circuit patterns, respectively.

The second and third circuit pattern grooves 131 and 141 may have the same depth as that of the first circuit pattern groove 121, and a lower insulating layer is not exposed by the second and third circuit pattern grooves 131 and 141.

The second and third circuit patterns 135 and 145 are formed by filling the second and third circuit pattern grooves 131 and 141.

The second and third circuit patterns 135 and 145 may have the same thickness as that of the first circuit pattern 125, and may include vias 138 and 148 connected with the via 126.

FIG. 2 shows a printed circuit board including circuit patterns having the total six layer structure in which each of the upper and lower portions of the core insulating layer 110 is formed in three layers, but the embodiment is not limited thereto.

A solder resist 150 may be further formed to cover the upper most circuit pattern 145.

The solder resist 150 exposes an extension part connected with the via 148 among the upper most circuit patterns 145 to form a pad.

The pad exposed by the solder resist 150 may further include a surface treatment layer 161. The surface treatment layer 161 may be formed through a plating process, or an OSP (organic solderability preservative) process.

A solder ball 160 is attached onto the pad to induce the electrical contact with an external device.

As shown in FIG. 2, the solder ball 160 may be attached onto the pad in the state that the solder ball 160 is spaced apart from the solder resist 150.

Hereinafter, the method of manufacturing the printed circuit board 100 of FIG. 2 will be described with reference to FIGS. 3 to 18.

Figure 3:

First, as shown in FIG. 3, the core insulating layer 110 is prepared.

The core insulating layer 110 may include a resin substrate having no glass fiber. The core insulating layer 110 may include a material having stiffness, preferably, polyimide film to satisfy following chemical formula.

[Chemical Formula 2]

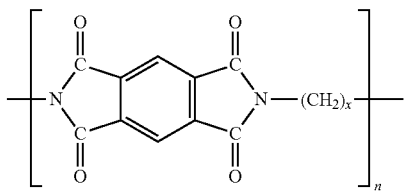

In chemical formula 2, n is a positive integer.

That is to say, in the core insulating layer 110, fillers may be dispersed in the polyimide resin expressed by the above chemical formula.

The filler may include AlO3 or SiO2 having a spherical shape or a rod shape.

The thickness of the core insulating layer 110 may be in the range of 15 μm to 200 μm, preferably, in the range of 100 μm to 150 μm.

Figure 4:
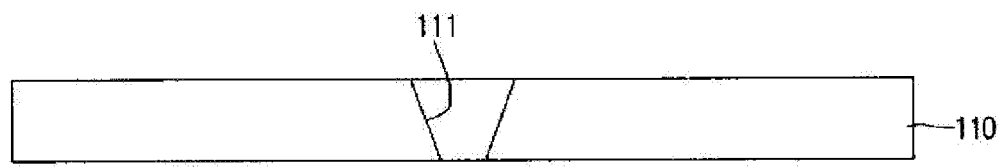

Next, as shown in FIG. 4, the via hole 111 is formed in the core insulating layer 110.

The via hole 111 may be formed by using a laser, and the laser may include a CO2 laser, or a UV-YAG laser. In addition, the via hole 111 may be formed through a physical scheme using a drill or a punch.

In this case, as shown in FIG. 4, the sectional area of the via hole 111 may be increased upward. Alternatively, the via hole 111 may be formed in a symmetric structure so that the sectional area of the via hole 111 is gradually increased from the central portion of the via hole 111.

Figure 5:

Thereafter, as shown in FIG. 5, the first circuit pattern groove 121 is formed in the core insulating layer 110.

The first circuit pattern groove 121 may be formed by using the UV-YAG laser or an excimer laser. In this case, the extension part may be formed on the top surface of the via hole 111.

Excimer lasers are classified into the 193 nm (ArF), 248 nm (KrF), and 308 nm (XeCl) lasers, and employ quartz masks due to the characteristics of the wavelengths.

The UV-YAG laser most preferably uses the wavelength of 355 nm. Since the wavelength band of the UV-YAG laser approximates the visible band, the UV-YAG laser may employ a glass mask.

Figure 6:
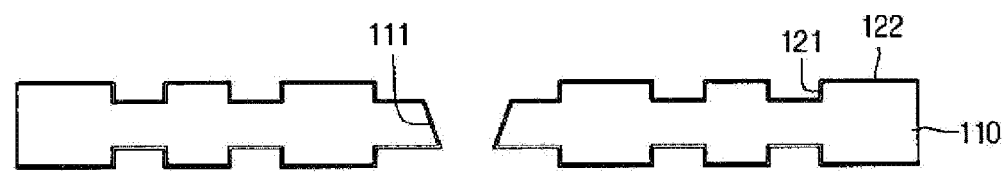

Subsequently, as shown in FIG. 6, the plating layer 128 is formed to cover the via hole 111 and the first circuit pattern groove 121.

Smears are removed from the surface of the core insulating layer 110 by performing a desmear process.

In other words, after bulging the core insulating layer 110, the bulged insulating layer is removed by using potassium permanganate, and a wet etching process to neutralize the surface of the core insulating layer 110 is performed to remove the smears.

Roughness may be provided on the surface of the core insulating layer 110 through the desmear process.

The seed layer 122 may be formed on the core insulating layer 110 through an electroless plating scheme.

The electroless plating scheme may be performed in the sequence of a degreasing process, a soft etching process, a pre-catalyst process, a catalyst treatment process, an accelerator process, an electroless plating process, and an anti-oxidation treatment process. In addition, the seed layer 122 may be formed by sputtering metallic particles using plasma.

The seed layer 122 includes the alloy including Cu, Ni, Pd, or Cr.

Figure 7:
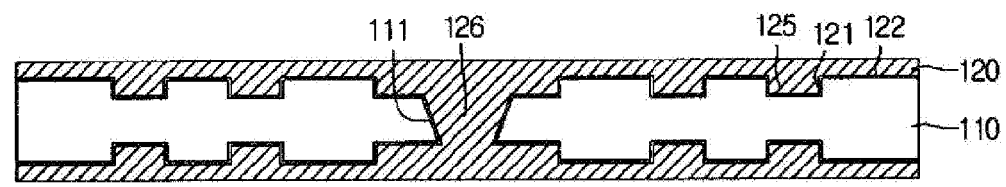

Next, an electroplating process is performed with respect to a conductive material using the seed layer 122 as a seed, thereby forming the plating layer 120 of FIG. 7.

The plating layer 120 may be formed by performing electroplating process while controlling current according to a plating area.

The plating layer 120 may include Cu representing high electrical conductivity.

In this case, an over-plating process is performed in order to minimize a dimple of the via hole 111, so that the height of the plating layer 120 from the top surface of the core insulating layer 110 is about 15 μm.

Then, as shown in FIG. 8, the plating layer 120 is removed from the core insulating layer 110.

The schemes of removing the plating layer 120 include a chemical etching scheme, a physical polishing scheme, and a chemical mechanical polishing (CMP) scheme, and at least two of the above schemes are applied.

Next, as shown in FIG. 9, the first insulating layer 130 is formed on the core insulating layer 110 to cover the first circuit pattern 125.

The first insulating layer 130 may include epoxy resin, but does not include additional glass fiber. The first insulating layer 130 may have the thickness thinner than that of the core insulating layer 110.

After forming the via hole 137 in the first insulating layer 130 as shown in FIG. 10, the second circuit pattern groove 131 is formed in the first insulating layer 130 as shown in FIG. 11.

The process of forming the via hole 137 may be the same as that shown in FIG. 4, and the process of forming the first circuit pattern groove 121 may be the same as that shown in FIG. 5.

Meanwhile, when forming the second circuit pattern groove 131, the via hole 137 may be formed together with the second circuit pattern groove 131 because the first insulating layer 130 does not include glass fiber.

Next, as shown in FIGS. 12 and 13, a plating layer 136 is formed by performing a plating process.

In a process of forming the plating layer 136, an electroplating process may be performed after forming the seed layer 132 similarly to the process of forming the plating layer 120 of the first circuit pattern 125.

Next, the second circuit pattern 135 of FIG. 14 is formed by etching the plating layer 136 that is over-plated.

Thereafter, as shown in FIG. 15, the second insulating layer 140 and the third circuit pattern 140 are formed.

The processes of forming the second insulating layer 140 and the third circuit pattern 145 may be performed by repeating the processes of forming the first insulating layer 130 and the second circuit pattern 135.

Next, as shown in FIG. 16, the extension part of the upper most layer connected with the via 126 is exposed and the solder resist 150 is formed to cover the third circuit pattern 145.

The solder resist 150 serves as a protective layer. The solder resist 150 is formed by performing an exposure and development process after applying a solder resist solution or laminating a dry film having the form of a film.

The extension part exposed by the solder resist 150 may serve as a pad.

Next, as shown in FIG. 15, in order to prevent the pad from being oxidized, the surface treatment layer 161 is formed through an OSP (organic solderability preservative) process or an electroless plating process using gold (Au) or tin (Sn).

Finally, a solder 160 is attached to a pad through an SOP (solder on pad) to mount a device.

In this case, the soldering process may be performed by performing a reflow process for a solder paste by screen-printing and heat-treating the solder paste, removing flux, and compressing the result structure.

As described above, since the element of the core insulating layer 110 includes isotropic polyimide without glass fiber, a substrate can be formed with a thin thickness while maintaining stiffness.

In addition, since the glass fiber is not included, the first circuit pattern 125 may be formed through a burying scheme, so that the thickness of the substrate can be reduced.

Further, the printed circuit board 110 can be totally miniaturized by forming the insulating layer with a thin thickness.

Hereinafter, the second embodiment will be described with reference to FIG. 19.

Referring to FIG. 19, a printed circuit board 100A according to the second embodiment includes the core insulating layer 110, the first to third circuit patterns 125, 135, and 145 formed at the upper portion or the lower portion of the core insulating layer 110, and the first and second insulating layers 130 and 140 to bury the second and third circuit patterns 135 and 145.

The core insulating layer 110 may include a resin substrate having no glass fiber. The core insulating layer 110 may include a material having stiffness, preferably, polyimide film to satisfy following chemical formula.

[Chemical Formula 3]

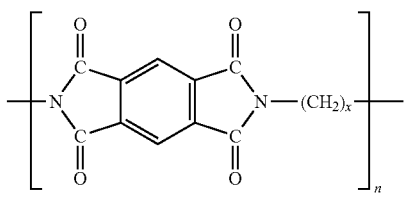

In chemical formula 3, n is a positive integer.

That is to say, in the core insulating layer 110, fillers may be dispersed in the polyimide resin expressed by the above chemical formula.

The filler may include AlO3 or SiO2 having a spherical shape or a rod shape.

The thickness of the core insulating layer 110 may be in the range of 15 μm to 200 μm, preferably, in the range of 100 μm to 150 μm.

The core insulating layer 110 may include a via hole 111 formed through the core insulating layer 110.

As shown in FIG. 2, the via hole 111 may have the shape having a sectional area increased upward. Alternatively, the via hole 111 may have a symmetric structure about a central region, but the embodiment is not limited thereto.

The conductive via 126 may be formed by filling the via hole 111, and may include a metallic material such as an alloy including at least one of Al, Cu, Ag, Pt, Ni, or Pd.

The first circuit pattern grooves 121 may be formed in the upper portion or the lower portion of the core insulating layer 110. The first circuit patterns 125 are filled in the first circuit pattern grooves 121 while serving as base circuit patterns.

The first circuit patterns 125 may include a material representing high electrical conductivity and low resistance, that is, may include a metallic material such as an alloy including at least one of Al, Cu, Ag, Pt, Ni, or Pd.

In this case, the first circuit pattern 125 may be formed in a single layer. Alternatively, the first circuit pattern 125 may be formed in a plurality of layers. If the first circuit pattern 125 is formed through a plating process, an electro-plated layer may be formed on a seed layer.

Meanwhile, the first and second insulating layers 130 and 140 are formed at the upper portion or the lower portion of the core insulating layer 110.

The first and second insulating layers 130 and 140 may have a two-layer structure as shown in FIG. 2. An insulating layer formed on the core insulating layer 110 may be the first insulating layer 130, and the second insulating layer 140 may be formed on the first insulating layer 130.

The first and second insulating layers 130 and 140 may include insulating layers having no glass fiber, preferably, may include a resin material including epoxy resin.

The first and second insulating layers 130 and 140 may include the same material, and may have the thicknesses thicker than that of the core insulating layer 110.

The first and second insulating layers 130 and 140 are provided in the surfaces thereof with the second and third circuit pattern grooves 131 and 141 to form circuit patterns, respectively.

The second and third circuit pattern grooves 131 and 141 may have the same depth as that of the first circuit pattern groove 121, and a lower insulating layer is not exposed by the second and third circuit pattern grooves 131 and 141.

The second and third circuit patterns 135 and 145 are formed by filling the second and third circuit pattern grooves 131 and 141.

The second and third circuit patterns 135 and 145 may have the same thickness as that of the first circuit pattern 125, and may include the vias 138 and 148 connected with the via 126.

The solder resist 150 may be further formed to cover the upper most circuit pattern 145.

The solder resist 150 exposes an extension part connected with the via 148 among the upper most circuit patterns 145 to form a pad.

The pad exposed by the solder resist 150 may further include the surface treatment layer 161. The surface treatment layer 161 may be formed through a plating process, or an OSP (organic solderability preservative) process.

A bump 170 may be formed on the pad.

The bump 170 may include the alloy including Cu, and may be formed through an electro-plating scheme using the solder resist 150 as a mask.

The bump 170 may have an area smaller than that of an opening of the solder resist 150.

Hereinafter, a third embodiment will be described with reference to FIGS. 20 to 36.

Referring to FIG. 20, a printed circuit board 100B according to the third embodiment includes the core insulating layer 110, the first to third circuit patterns 125, 135, and 145 formed at the upper portion or the lower portion of the core insulating layer 110, and the first and second insulating layers 130 and 140 to bury the second and third circuit patterns 135 and 145.

The core insulating layer 110 may include a resin substrate having no glass fiber. The core insulating layer 110 may include a material having stiffness, preferably, polyimide film to satisfy following chemical formula.

[Chemical Formula 4]

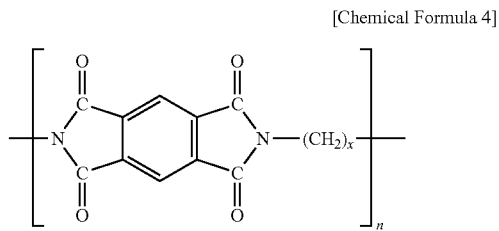

In chemical formula 4, n is a positive integer.

That is to say, in the core insulating layer 110, fillers may be dispersed in the polyimide resin expressed by the above chemical formula.

The filler may include AlO3 or SiO2 having a spherical shape or a rod shape.

The thickness of the core insulating layer 110 may be in the range of 15 µm to 200 µm, preferably, in the range of 100 µm to 150 µm.

The core insulating layer 110 may include a via hole 111 formed through the core insulating layer 110.

As shown in FIG. 2, the via hole 111 may have the shape having a sectional area increased upward. Alternatively, the via hole 111 may have a symmetric structure about a central region, but the embodiment is not limited thereto.

The conductive via 126 may be formed by filling the via hole 111, and may include a metallic material such as an alloy including at least one of Al, Cu, Ag, Pt, Ni, or Pd.

The first circuit pattern grooves 121 may be formed in the upper portion or the lower portion of the core insulating layer 110. The first circuit patterns 125 are filled in the first circuit pattern grooves 121 while serving as base circuit patterns.

The first circuit patterns 125 may include a material representing high electrical conductivity and low resistance, that is, may include a metallic material such as an alloy including at least one of Al, Cu, Ag, Pt, Ni, or Pd.

In this case, the first circuit pattern 125 may be formed in a single layer. Alternatively, the first circuit pattern 125 may be formed in a plurality of layers. If the first circuit pattern 125 is formed through a plating process, an electro-plated layer may be formed on a seed layer.

Meanwhile, a plurality of insulating layers I1 and I2 are formed at the upper portion or the lower portion of the core insulating layer 110.

The insulating layers I1 and I2 may have a two-layer structure as shown in FIG. 20. An insulating layer formed on the core insulating layer 110 may be the first insulating layer I1, and the second insulating layer I2 may be formed on the first insulating layer I1.

The insulating layers I1 and I2 may have a multi-layer structure.

In other words, the lower layers 130 and 140 of the first and second insulating layers I1 and I2 may include insulating layers including glass fiber, the glass fiber may be contained in a resin material, and fillers may be dispersed in the resin material.

In this case, the first and second insulating layers I1 and I2 have thickness thinner than that of the core insulating layer 110.

The second and third circuit patterns 135 and 145 are formed on the lower layers 130 and 140 of the first and second insulating layers I1 and I2.

The first and second insulating layers I1 and I2 include the first and second pattern insulating layers 133 and 143 formed on the lower layers 130 and 140 to surround the second and third circuit patterns 135 and 145, respectively.

Different from the lower layers 130 and 140, the first and second pattern insulating layers 133 and 143 may include resin materials having no glass fiber, and fillers may be dispersed in the resin material. The first and second pattern insulating layers 133 and 143 may be formed in the form of an ABF (Ajinomoto build up film), but the embodiment is not limited thereto.

The first and second insulating layers 133 and 143 are provided in the surfaces thereof with second and third circuit pattern grooves 131 and 141 to form circuit patterns, respectively.

The second and third circuit pattern grooves 131 and 141 may have the same depth as that of the first circuit pattern groove 121, and the lower insulating layers 130 and 140 are not exposed by the second and third circuit pattern grooves 131 and 141.

The second and third circuit patterns 135 and 145 are formed by filling the second and third circuit pattern grooves 131 and 141.

The second and third circuit patterns 135 and 145 may have the same thickness as that of the first circuit pattern 125, and may include the vias 138 and 148 connected with the via 126.

FIG. 20 shows a printed circuit board including circuit patterns having the total six layer structure in which each of the upper and lower portions of the core insulating layer 110 is formed in three layers, but the embodiment is not limited thereto.

The solder resist 150 may be further formed to cover the upper most circuit pattern 145.

The solder resist 150 exposes an extension part connected with the via 148 among the upper most circuit patterns 145 to form a pad.

The pad exposed by the solder resist 150 may further include the surface treatment layer 161. The surface treatment layer 161 may be formed through a plating process, or an OSP (organic solderability preservative) process.

The solder ball 160 is attached onto the pad to induce the electrical contact with an external device.

As shown in FIG. 2, the solder ball 160 may be attached onto the pad in the state that the solder ball 160 is spaced apart from the solder resist 150.

Hereinafter, a printed circuit board 100B of FIG. 20 will be described with reference to FIGS. 21 to 36.

First, as shown in FIG. 21, the core insulating layer 110 is prepared.

The core insulating layer 110 may include a resin substrate having no glass fiber. The core insulating layer 110 may include a material having stiffness, preferably, polyimide film to satisfy following chemical formula.

[Chemical Formula 5]

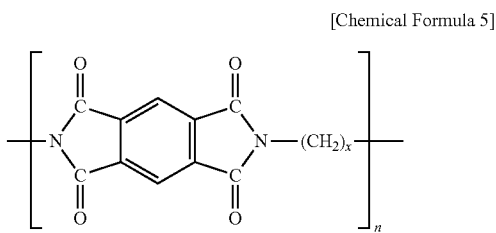

In chemical formula 5, n is a positive integer.

That is to say, in the core insulating layer 110, fillers may be dispersed in the polyimide resin expressed by the above chemical formula.

The filler may include AlO3 or SiO2 having a spherical shape or a rod shape.

The thickness of the core insulating layer 110 may be in the range of 15 μm to 200 μm, preferably, in the range of 100 μm to 150 μm.

Next, as shown in FIG. 22, the via hole 111 is formed in the core insulating layer 110.

The via hole 111 may be formed by using a laser, and the laser may include a CO2 laser, or a UV-YAG laser. In addition, the via hole 111 may be formed through a physical scheme using a drill or a punch.

In this case, as shown in FIG. 22, the sectional area of the via hole 111 may be increased upward. Alternatively, the via hole 111 may be formed in a symmetric structure so that the sectional area of the via hole 111 is gradually increased from the central portion of the via hole 111.

Thereafter, as shown in FIG. 23, the first circuit pattern groove 121 is formed in the core insulating layer 110.

The first circuit pattern groove 121 may be formed by using the UV-YAG laser or an excimer laser. In this case, the extension part may be formed on the top surface of the via hole 111.

Excimer lasers are classified into the 193 nm (ArF), 248 nm (KrF), and 308 nm (XeCl) lasers, and employ quartz masks due to the characteristics of the wavelengths.

The UV-YAG laser most preferably uses the wavelength of 355 nm. Since the wavelength band of the UV-YAG laser approximates the visible band, the UV-YAG laser may employ a glass mask.

Subsequently, as shown in FIG. 25, the plating layer 120 is formed to cover the via hole 111 and the first circuit pattern groove 121.

Smears are removed from the surface of the core insulating layer 110 by performing a desmear process.

In other words, after bulging the core insulating layer 110, the bulged insulating layer is removed by using potassium permanganate, and a wet etching process to neutralize the surface of the core insulating layer 110 is performed to remove the smears.

Roughness may be provided on the surface of the core insulating layer 110 through the desmear process.

The seed layer 122 of FIG. 24 may be formed on the core insulating layer 110 through an electroless plating scheme.

The electroless plating scheme may be performed in the sequence of a degreasing process, a soft etching process, a pre-catalyst process, a catalyst treatment process, an accelerator process, an electroless plating process, and an anti-oxidation treatment process. In addition, the seed layer 122 may be formed by sputtering metallic particles using plasma.

The seed layer 122 includes the alloy including Cu, Ni, Pd, or Cr.

Next, an electroplating process is performed with respect to a conductive material using the seed layer 122 as a seed, thereby forming the plating layer 120 of FIG. 25.

The plating layer 120 may be formed by performing electroplating process while controlling current according to a plating area.

The plating layer 120 may include Cu representing high electrical conductivity.

In this case, an over-plating process is performed in order to minimize a dimple of the via hole 111, so that the height of the plating layer 120 from the top surface of the core insulating layer 110 is about 15 μm.

Then, as shown in FIG. 26, the plating layer 120 is removed from the first insulating layer 130.

The schemes of removing the plating layer 120 include a chemical etching scheme, a physical polishing scheme, and a chemical mechanical polishing (CMP) scheme, and at least two of the above schemes are applied.

Next, as shown in FIG. 27, the lower layer 130 and the first pattern insulating layer 133 constituting the first insulating layer I1 are formed on the core insulating layer 110 to cover the first circuit pattern 125.

The lower layer 130 includes an insulating layer including glass fiber, and the first pattern insulating layer 133 may include epoxy resin, but does not include additional glass fiber. The lower layer 130 may have the thickness thinner than that of the core insulating layer 110.

In this case, the first insulating layer I1 may be formed in a single layer. If the first insulating layer I1 is formed in the single layer, a region formed of a resin must be ensured to the extent that a circuit pattern can be formed on the peak of the glass fiber.

The first insulating layer I1 may be laminated together with a copper foil layer. If the first insulating layer I1 is laminated together with the copper foil layer, the copper foil layer is removed after the subsequent via hole process.

The second circuit pattern groove 131 of FIG. 29 is formed by irradiating a laser onto the pattern insulating layer 133.

When the second circuit pattern groove 131 is formed, after the via hole 137 is formed through the first insulating layer I1, since the pattern insulating layer 133 does not include glass fiber, the extension part of the via 126 may be open.

Next, as shown in FIG. 31, the plating layer 136 is formed by performing a plating process.

In a process of forming the plating layer 136, an over-plating process may be performed after forming the seed layer 132 of FIG. 10 similarly to the process of forming the plating layer 120 of the first circuit pattern 125.

Next, the second circuit pattern 135 of FIG. 32 is formed.

Thereafter, as shown in FIG. 33, the second insulating layer I2 and the third circuit pattern 145 are formed.

The processes of forming the second insulating layer I2 and the third circuit pattern 145 may be performed by repeating the processes of forming the first insulating layer I1 and the second circuit pattern 135.

Next, as shown in FIG. 34, the extension part of the upper most layer connected with the via 126 is exposed and the solder resist 150 is formed to cover the third circuit pattern 145.

Next, as shown in FIG. 35, in order to prevent the pad from being oxidized, the surface treatment layer 161 is formed through an OSP (organic solderability preservative) process or an electroless plating process using gold (Au) or tin (Sn).

Finally, the solder 160 is attached to the pad through an SOP (solder on pad) to mount a device.

In this case, the soldering process may be performed by performing a reflow process for a solder paste by screen-printing and heat-treating the solder paste, removing flux, and compressing the result structure.

As described above, since the element of the core insulating layer 110 includes isotropic polyimide without glass fiber, a substrate can be formed with a thin thickness while maintaining stiffness.

In addition, since the glass fiber is not included, the first circuit pattern 125 may be formed through a burying scheme, so that the thickness of the substrate can be reduced.

Further, the printed circuit board 110 can be totally miniaturized by forming the insulating layer with a thin thickness.

Hereinafter, a fourth embodiment will be described with reference to FIG. 37.

Referring to FIG. 37, a printed circuit board 100C according to the fourth embodiment includes the core insulating layer 110, the first to third circuit patterns 125, 135, and 145 formed at the upper portion or the lower portion of the core insulating layer 110, and the first and second insulating layers 130 and 140 to bury the second and third circuit patterns 135 and 145.

The core insulating layer 110 may include a resin substrate having no glass fiber. The core insulating layer 110 may include a material having stiffness, preferably, polyimide film to satisfy following chemical formula.

In other words, in the core insulating layer 110, fillers may be dispersed in polyimide resin.

The filler may include AlO3 or SiO2 having a spherical shape or a rod shape.

The thickness of the core insulating layer 110 may be in the range of 15 μm to 200 μm, preferably, in the range of 100 μm to 150 μm.

The core insulating layer 110 may include a via hole 111 formed through the core insulating layer 110.

As shown in FIG. 37, the via hole 111 may have the shape having a sectional area increased upward. Alternatively, the via hole 111 may have a symmetric structure about a central region, but the embodiment is not limited thereto.

The conductive via 126 may be formed by filling the via hole 111, and may include a metallic material such as an alloy including at least one of Al, Cu, Ag, Pt, Ni, or Pd.

The first circuit pattern grooves 121 may be formed in the upper portion or the lower portion of the core insulating layer 110. The first circuit patterns 125 are filled in the first circuit pattern grooves 121 while serving as base circuit patterns.

The first circuit patterns 125 may include a material representing high electrical conductivity and low resistance, that is, may include a metallic material such as an alloy including at least one of Al, Cu, Ag, Pt, Ni, or Pd.

In this case, the first circuit pattern 125 may be formed in a single layer. Alternatively, the first circuit pattern 125 may be formed in a plurality of layers. If the first circuit pattern 125 is formed through a plating process, an electro-plated layer may be formed on a seed layer.

Meanwhile, a plurality of insulating layers I1 and I2 are formed at the upper portion or the lower portion of the core insulating layer 110.

The insulating layers I1 and I2 may have a two-layer structure as shown in FIG. 37. An insulating layer formed on the core insulating layer 110 may be the first insulating layer I1, and the second insulating layer I2 may be formed on the first insulating layer I1.

The insulating layers I1 and I2 may have a multi-layer structure.

In other words, the lower layers 130 and 140 of the first and second insulating layers I1 and I2 may include insulating layers including glass fiber, the glass fiber may be contained in a resin material, and fillers may be dispersed in the resin material.

In this case, the first and second insulating layers I1 and I2 have thickness thinner than that of the core insulating layer 110.

The second and third circuit patterns 135 and 145 are formed on the lower layers 130 and 140 of the first and second insulating layers I1 and I2.

The first and second insulating layers I1 and I2 include the first and second pattern insulating layers 133 and 143 formed on the lower layers 130 and 140 to surround the second and third circuit patterns 135 and 145, respectively.

Different from the lower layers 130 and 140, the first and second pattern insulating layers 133 and 143 may include resin materials having no glass fiber, and fillers may be dispersed in the resin material. The first and second pattern insulating layers 133 and 143 may be formed in the form of an ABF (Ajinomoto build up film), but the embodiment is not limited thereto.

The first and second insulating layers 133 and 143 are provided in the surfaces thereof with second and third circuit pattern grooves 131 and 141 to form circuit patterns, respectively.

The second and third circuit pattern grooves 131 and 141 may have the same depth as that of the first circuit pattern groove 121, and the lower insulating layers 130 and 140 are not exposed by the second and third circuit pattern grooves 131 and 141.

The second and third circuit patterns 135 and 145 are formed by filling the second and third circuit pattern grooves 131 and 141.

The second and third circuit patterns 135 and 145 may have the same thickness as that of the first circuit pattern 125, and may include the vias 138 and 148 connected with the via 126.

FIG. 37 shows a printed circuit board including circuit patterns having the total six layer structure in which each of the upper and lower portions of the core insulating layer 110 is formed in three layers, but the embodiment is not limited thereto.

The solder resist 150 may be further formed to cover the upper most circuit pattern 145.

The solder resist 150 exposes an extension part connected with the via 148 among the upper most circuit patterns 145 to form a pad.

The pad exposed by the solder resist 150 may further include the surface treatment layer 161. The surface treatment layer 161 may be formed through a plating process, or an OSP (organic solderability preservative) process.

The bump 170 may be formed on the pad.

The bump 170 may include the alloy including Cu, and may be formed through an electro-plating scheme using the solder resist 150 as a mask.

The bump 170 may have an area smaller than that of an opening of the solder resist 150.

Although a preferred embodiment has been described for illustrative purposes, those skilled in the art will appreciate that various modifications, additions and substitutions are possible, without departing from the scope and spirit of the invention as disclosed in the accompanying claims.

The invention claimed is:

1. A printed circuit board comprising:
a core insulating layer comprising an isotropic resin;
a first circuit pattern filled in a first circuit pattern groove at an upper portion or a lower portion of the core insulating layer;
a lower insulating layer disposed on the core insulating layer and having a first via hole;
a first via filled in the via hole of the lower insulating layer;
a pattern insulating layer disposed on the lower insulating layer and having a second circuit pattern groove, wherein the second circuit pattern groove is separate from the first via,
a second circuit pattern filled in the second circuit pattern groove of the pattern insulating layer;
a first extension part formed through the pattern insulating layer and connected with the first via, and the first extension part is separate from the second circuit pattern,
wherein a thickness of the pattern insulating layer is same as a thickness of the second circuit pattern,
wherein a thickness of the lower insulating layer is same as a thickness of the via,
wherein the second circuit pattern groove is formed passing through the pattern insulating layer,
wherein the first via hole is formed passing through the lower insulating layer,
wherein a thickness of the first extension part is same as a thickness of the pattern insulating layer,
wherein the pattern insulating layer comprises a material different from a material constituting the core insulating layer,
wherein the lower insulating layer is in direct physical contact with the core insulating layer,
wherein the pattern insulating layer is in direct physical contact with the lower insulating layer, and
wherein the pattern insulating layer has a thickness thinner than that of the lower insulating layer,
wherein the pattern insulating layer comprises a material different from a material constituting the lower insulating layer,
wherein the core insulating layer includes polyimide resin and does not include glass fiber,
wherein the lower insulating layer includes a resin material containing glass fiber, and
wherein the pattern insulating layer includes a resin material having no glass fiber, and
wherein the lower insulating layer is disposed between the core insulating layer and the pattern insulating layer.

2. The printed circuit board of claim 1, further comprising a second via formed through the core insulating layer.

3. The printed circuit board of claim 2, further comprising a second extension part to extend from the second via at the upper portion or the lower portion of the core insulating layer,
wherein the second extension part has the same depth as that of the first circuit pattern, and the second extension part is separate from the first circuit pattern.

4. The printed circuit board of claim 1, wherein the core insulating layer has a thickness in a range of 100 μm to 150 μm.

5. The printed circuit board of claim 1 wherein the core insulating layer includes the polyimide resin to satisfy following chemical formula

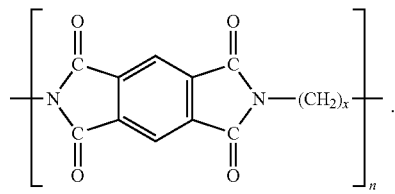

* * * * *